(12) United States Patent
Cheah

(10) Patent No.: US 6,818,968 B1
(45) Date of Patent: Nov. 16, 2004

(54) INTEGRATED CIRCUIT PACKAGE AND PROCESS FOR FORMING THE SAME

(75) Inventor: Eng-Chew Cheah, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/863,651

(22) Filed: May 22, 2001

Related U.S. Application Data

(60) Provisional application No. 60/240,389, filed on Oct. 12, 2000.

(51) Int. Cl.[7] ............................................. H01L 23/495
(52) U.S. Cl. ........................ 257/666; 257/667; 257/670
(58) Field of Search ................................. 438/106, 124, 438/126, 112, 127, FOR 384; 257/787, 790, 666, 667, 670

(56) References Cited

U.S. PATENT DOCUMENTS

| | | | | |
|---|---|---|---|---|
| 3,706,840 A | * | 12/1972 | Moyle et al. ............... | 174/52.2 |
| 3,736,475 A | * | 5/1973 | Berner ......................... | 257/666 |
| 4,788,583 A | * | 11/1988 | Kawahara et al. .......... | 174/52.2 |
| 5,055,911 A | * | 10/1991 | Ogata .......................... | 257/711 |
| 5,185,653 A | * | 2/1993 | Switky et al. ............... | 257/729 |
| 5,206,794 A | * | 4/1993 | Long ........................... | 257/675 |
| 5,278,446 A | * | 1/1994 | Nagaraj et al. .............. | 257/707 |
| 5,550,406 A | * | 8/1996 | McCormick ................ | 257/666 |
| 5,723,899 A | * | 3/1998 | Shin ............................ | 257/666 |
| 5,807,768 A | * | 9/1998 | Shin ............................ | 438/127 |
| 5,989,940 A | * | 11/1999 | Nakajima .................... | 438/127 |
| 5,998,867 A | * | 12/1999 | Jensen et al. ................ | 174/104 |
| 6,133,623 A | * | 10/2000 | Otsuki et al. ............... | 257/666 |
| 6,384,487 B1 | * | 5/2002 | Smith .......................... | 257/666 |

FOREIGN PATENT DOCUMENTS

| | | | |
|---|---|---|---|
| JP | 3-58453 | * | 3/1991 |
| JP | 3-82059 | * | 4/1991 |
| JP | 404213864 | * | 8/1992 |
| JP | 402278845 | * | 11/1992 |
| JP | 5-67708 | * | 3/1993 |
| JP | 405315510 | * | 11/1993 |
| JP | 406169033 | * | 6/1994 |
| JP | 410022422 | * | 1/1998 |

* cited by examiner

*Primary Examiner*—Erik Kielin
*Assistant Examiner*—James Mitchell
(74) *Attorney, Agent, or Firm*—Morgan, Lewis & Bockius, LLP

(57) ABSTRACT

An integrated circuit package and a process for forming the same. The package includes a semiconductor die with bond pads, a die attachment pad on which the semiconductor die is attached, and a substrate on which the die attachment pad is positioned. A non-conductive lead finger mounting ring is attached to the peripheral region of the substrate. Package leads are attached to the lead finger mounting ring, and are electrically coupled to the bond pads via bond wires. The bond wires are enclosed in an epoxy material having an approximately rounded top surface. The die, the die attachment pad, the substrate, the lead finger mounting ring, and the epoxy material are enclosed in a mold compound.

9 Claims, 8 Drawing Sheets

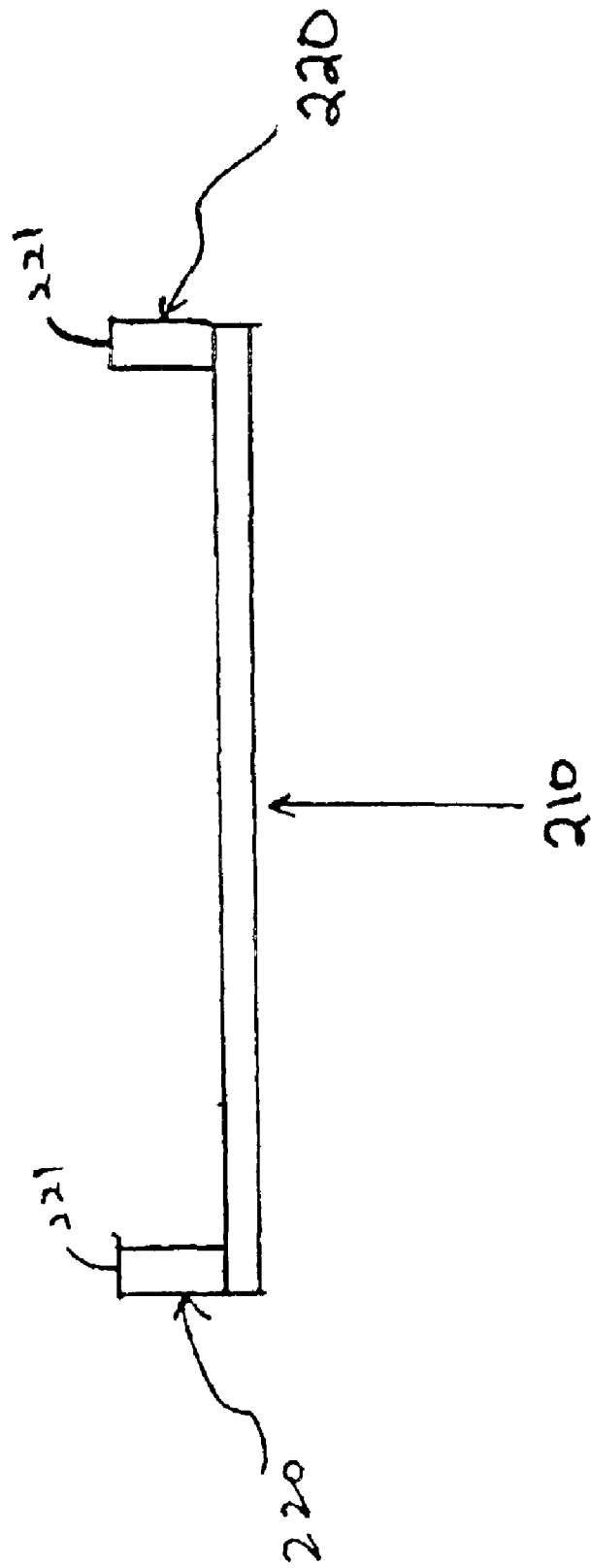

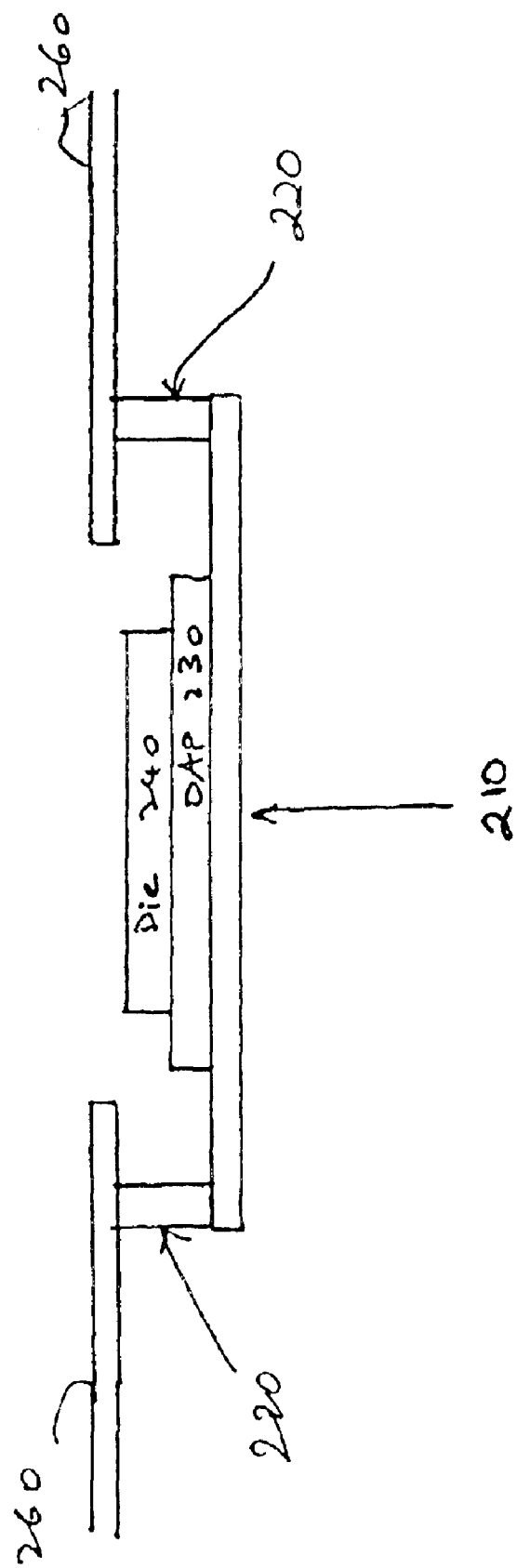

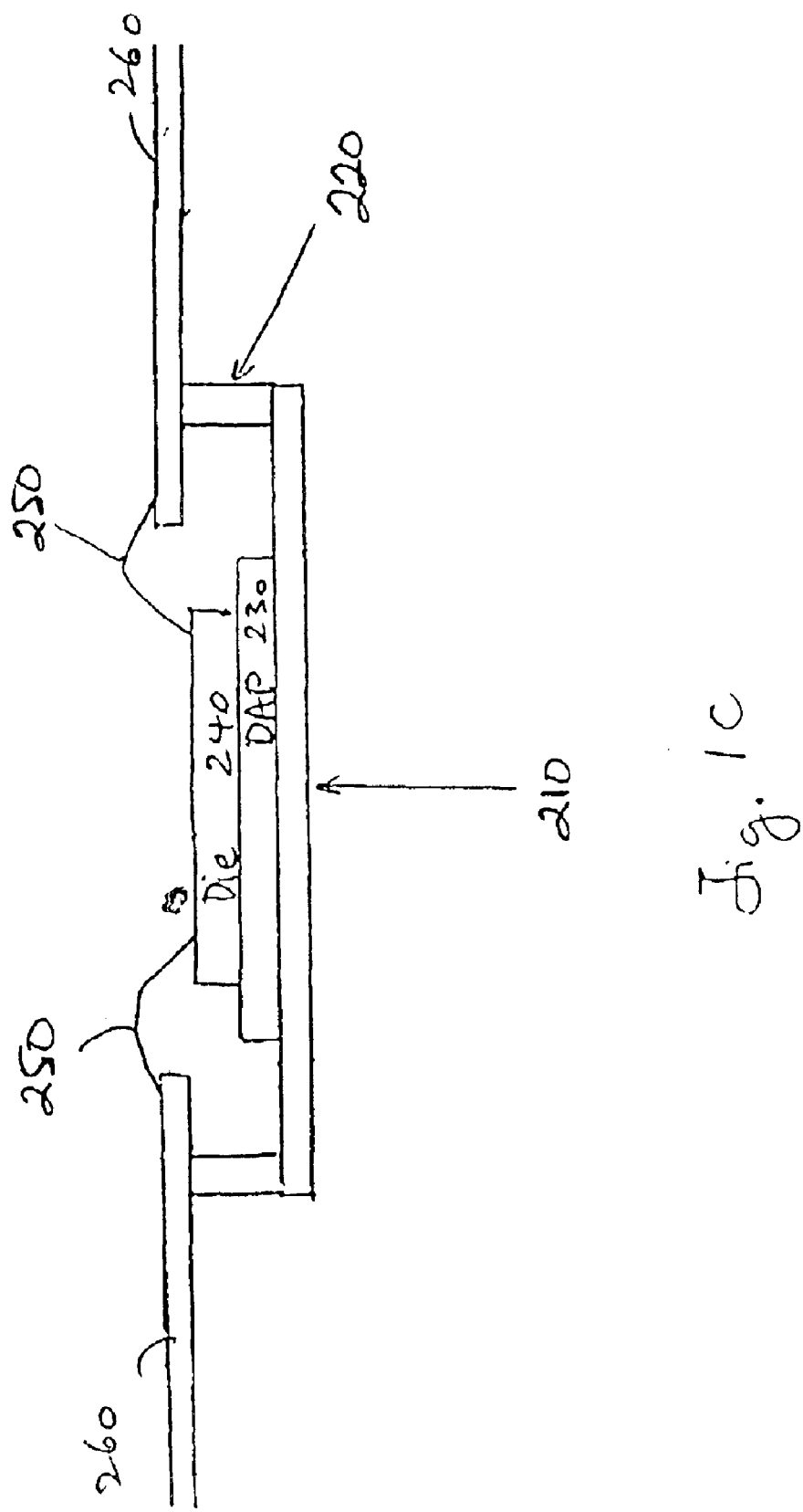

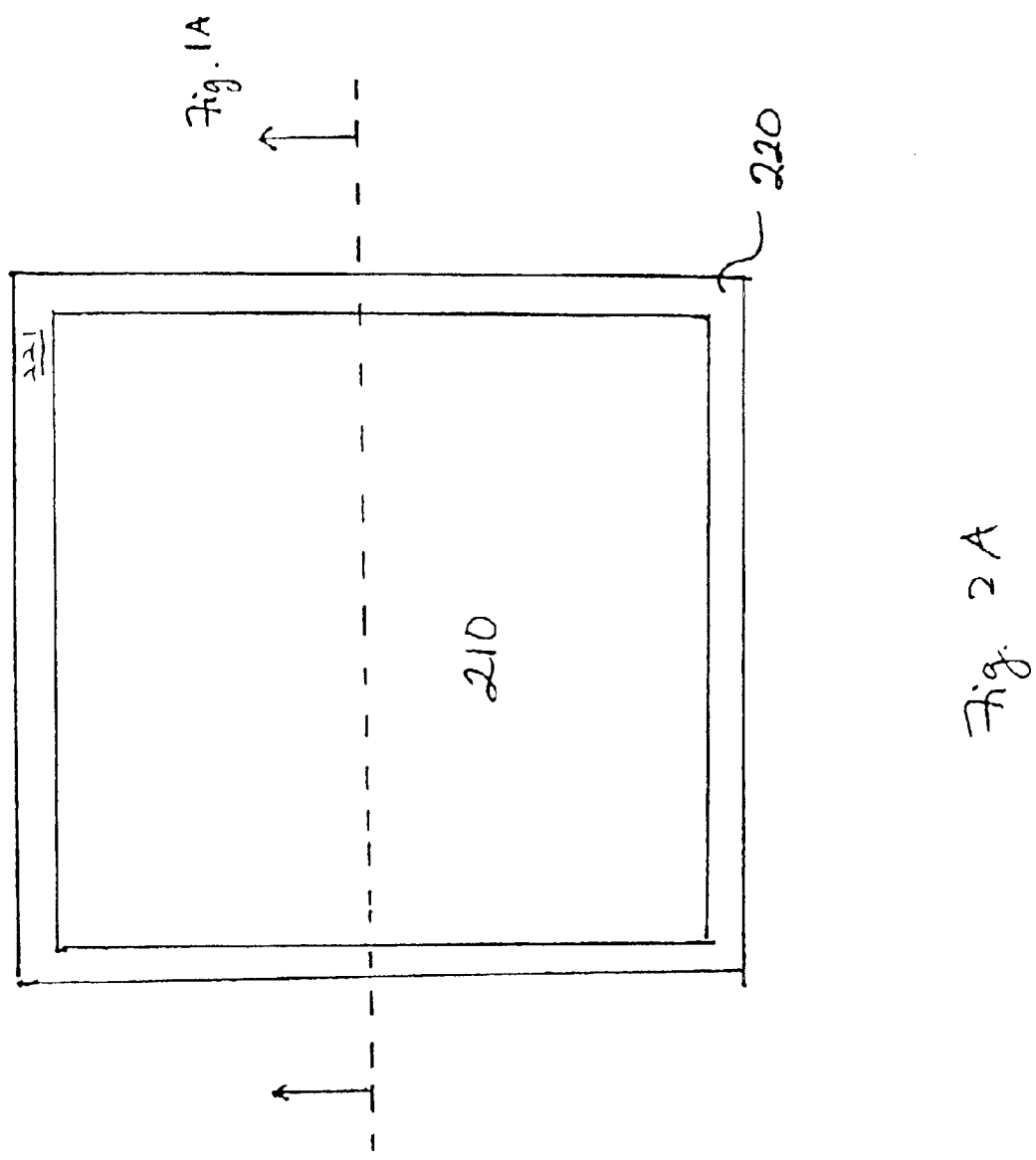

INTEGRATED CIRCUIT PACKAGE AND PROCESS FOR FORMING THE SAME

This application claims priority to the provisional patent application entitled, "Package for a Fine Pad Pitch Semiconductor Die and Process for Forming The Same," Ser. No. 60/240,389, filed Oct. 12, 2000.

BRIEF DESCRIPTION OF THE INVENTION

The present, invention relates generally to the field of semiconductor packaging. More specifically, the present invention relates to an integrated circuit package and a process for forming the same.

BACKGROUND OF THE INVENTION

Most integrated circuit packages share a substantially standard construction. Specifically, the actual circuitry is on a semiconductor die, which is mounted, usually by adhesive, to a relatively large (as compared to the die) mass or "slug" which acts as a heat sink.

The die has a plurality of bond pads through which power, ground, and signals are communicated outside the die. Bond wires are bonded, typically by a process known as "wirebonding," to the bond pads. The other ends of the bond wires are wirebonded to one of a plurality of metallic lead fingers, or package leads, that lay on the heat sinking mass but are separated from it by a non-conductive layer. The nonconductive layer is typically an insulating adhesive tape, although it may be other materials such as a ceramic layer bonded to the heat sinking mass.

The package leads are generally formed by stamping from a single sheet of suitable conductive metal. The portions which are to protrude from the package as pins are joined together by a rectangular band of metal at their outer extremities, forming a unit known as a leadframe. To assemble the integrated circuit package, the insulating layer is applied to the heat sinking mass, and the leadframe is attached in place. The die is subsequently affixed, and the wire leads are wirebonded to the appropriate bond pads and package leads.

The entire assembly is then encased in a plastic or epoxy "mold compound" with ends of the package leads protruding as pins for connection to external devices.

As integrated circuit devices become more complex, the die sizes are becoming smaller. Decreasing die sizes have resulted in finer bond pad pitches, longer bond wire lengths, and closer wire-to-wire separation. At the same time, bond wire diameters are becoming thinner.

With the increase of bond wire span, reduction of bond wire diameter, and reduction in wire-to-wire separation, various problems arise in packaging these integrated circuits. One particularly glaring problem is that, when the bond wires are subject to injection molding, adjacent bond wires may come into contact with each other to form short-circuits.

Accordingly, it would be highly desirable to provide an improved integrated circuit package that overcomes the problems associated with increasing bond wire span, reduced bond wire diameter, and reduced wire-to-wire separation.

SUMMARY OF THE DISCLOSURE

The invention provides an improved integrated package and a process for forming the same. According to an embodiment of the invention, a substrate is first provided. A non-conductive lead finger mounting ring is attached to the peripheral region of the substrate. A die attachment pad (DAP) is attached onto the substrate and a plurality of lead fingers are attached to the non-conductive lead finger mounting ring. A semiconductor die is then attached onto the DAP. Bond wires are attached to the semiconductor die and to the lead fingers. An epoxy material is then dispensed over the semiconductor die, forming a protective encapsulation for the bond wires. The epoxy material is then cured. Thereafter, a mold compound is dispensed and molded to form a plastic encapsulation of the package. The epoxy encapsulation protects the bond wires from the mold compound, and prevents adjacent bond wires from short circuiting during the molding process. Thus, the present invention is particularly applicable to semiconductor dies that have a fine pad pitch.

A completed semiconductor package includes a semiconductor die with bond pads, a die attachment pad on which the semiconductor die is attached, and a substrate on which the die attachment pad is positioned. A non-conductive lead finger mounting ring is attached to the peripheral region of the substrate. Lead fingers are coupled to the lead finger mounting ring, and are coupled to the bond pads via bond wires. The bond wires are enclosed in an epoxy material. The die, the die attachment pad, the substrate, the lead finger mounting ring, and the epoxy material are enclosed in a mold compound.

BRIEF DESCRIPTION OF THE DRAWINGS

For a better understanding of the invention, reference should be made to the following detailed description taken in conjunction with the accompanying drawings, in which:

FIGS. 1A–1E are cross-sectional views illustrating steps of an integrated circuit packaging process according to the present invention.

FIGS. 2A–2B are top views illustrating steps of the integrated circuit packaging process according to the present invention.

Like reference numerals refer to corresponding parts throughout the drawings.

DETAILED DESCRIPTION OF THE DRAWINGS

FIGS. 1A–1E are side cross-sectional views illustrating steps of an integrated circuit packaging process in accordance with one embodiment of the present invention. In the following, FIGS. 1A–1E are discussed in conjunction with FIGS. 2A and 2B, which are top plan views of FIGS. 1A and 1C, respectively. Additionally, FIGS. 1A–1E and 2A–2B are discussed in conjunction with FIG. 3, which is a flow diagram depicting the integrated circuit packaging process.

Figure 1D:
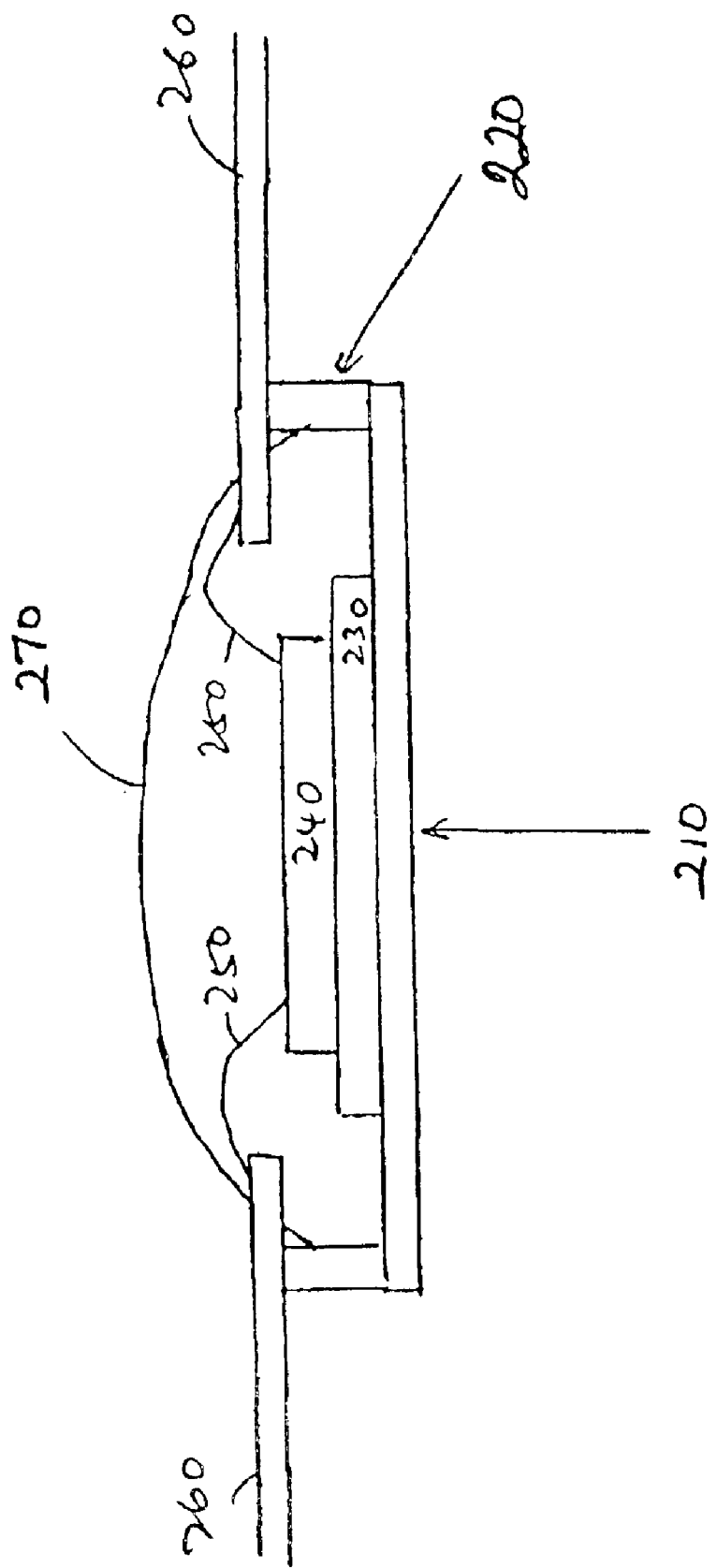
Figure 2B:
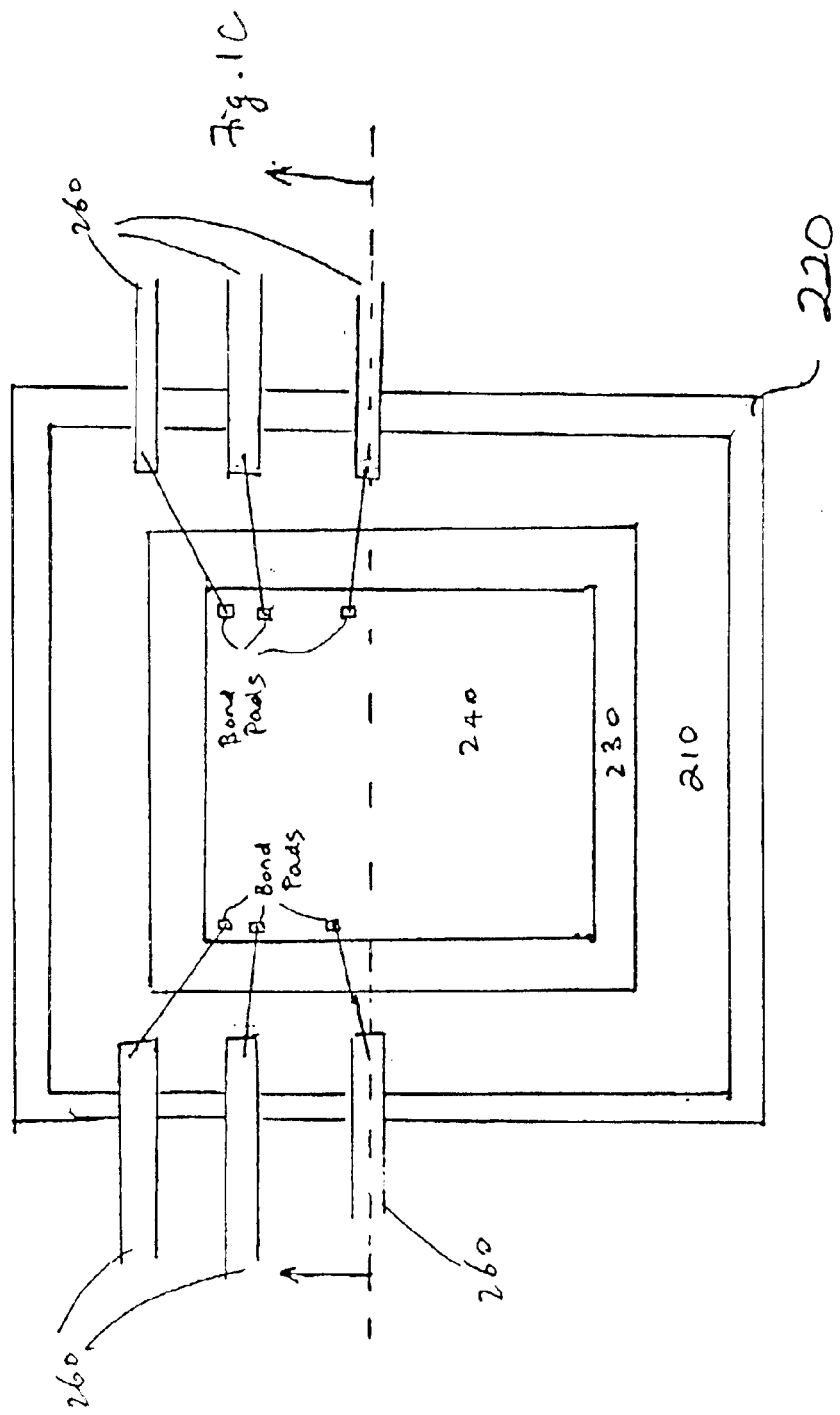
Figure 3:
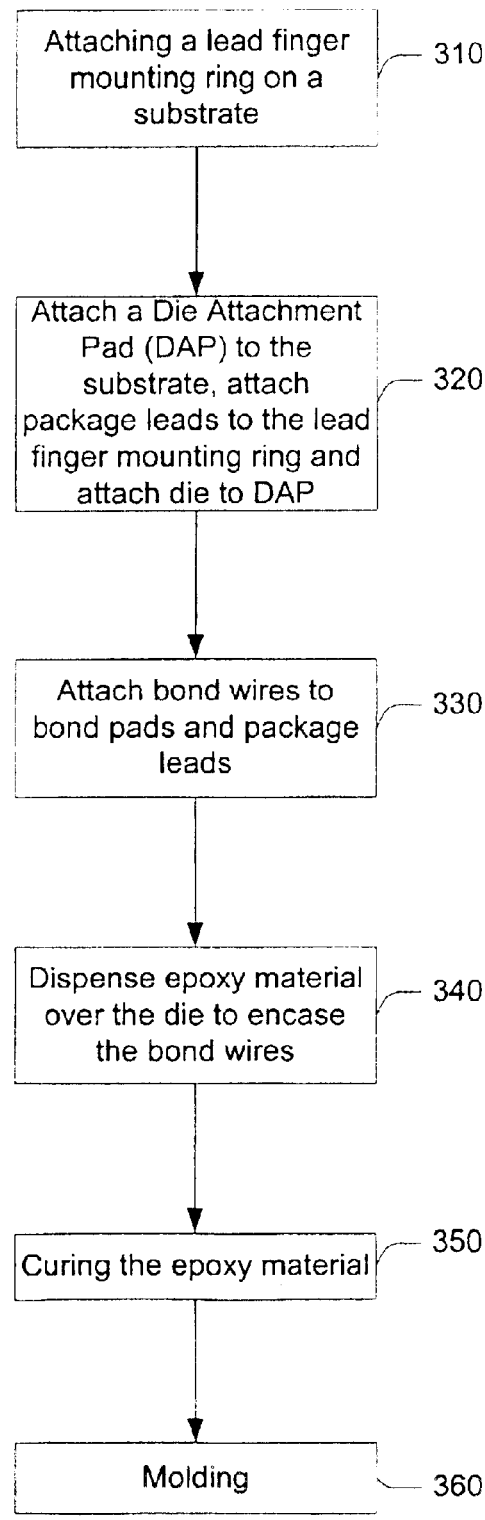
FIG. 3 is a flow diagram illustrating a process of forming an integrated circuit package according to an embodiment of the invention.

With reference now to FIG. 3, the integrated circuit packaging process 300 of the present embodiment begins with providing a substrate having a lead finger mounting ring attached thereto (Box 310). A side view of a substrate 210 having a lead finger mounting ring 220 attached to its periphery is shown in FIG. 1A. A top view of the substrate 210 and the lead finger mounting ring 220 is shown in FIG. 2A. Although it is shown in FIG. 1A and FIG. 2A that the lead finger mounting ring 220 is attached to the peripheral region of the substrate 210, it should be understood that the lead finger mounting ring 220 may be attached to other portions of the substrate as well. According to one aspect of the invention, substrate 210 may be conductive or non-conductive, while the lead finger mounting ring 220 is entirely non-conductive, or non-conductive on its top surface 221.

With reference again to FIG. 3, the process 300 continues with attaching a Die Attachment Pad (DAP) to the substrate, attaching package leads to the lead finger mounting ring, and attaching a die on the DAP (Box 320). The result of these steps is illustrated in FIG. 1B. As shown in FIG. 1B, a DAP 230 is attached to a center region of the substrate 210, and package leads 260 are attached to the lead finger mounting ring 220. Furthermore, as shown in FIG. 1B, a die 240 is attached to the DAP 230. In an alternate embodiment of the invention, the die 240 is attached directly to the substrate 210 using an insulating epoxy or the like. Additionally, in alternate embodiments, the DAP and the die may be attached to any other region(s) of the substrate.

Referring now to FIG. 3 again, the process 300 includes attaching bond wires between bond pads on the die and the package leads (Box 330). This step is sometimes referred to as "wirebonding" and is well known in the art. The result of this step is illustrated in FIGS. 1C. As shown in FIG. 1C, bond wires 250 are attached between bond pads on the die 240 and the package leads 260. Note that the bond wires 250 are attached to the top surface of the package leads 260 and the top surface of the die 240. Thus, the bond wires 250 are elevated above the lead finger mounting ring 220. A top view of the die assembly of FIG. 1C is shown in FIG. 2B. Note that, for simplicity, only a few bond pads and a few package leads 260 are illustrated.

With reference yet again to FIG. 3, the process 300 includes dispensing sufficient amount of an epoxy material on the die such that the bond wires are encased by the epoxy material (Box 340). The result of this step is illustrated in FIG. 1D. As shown in FIG. 1D, the top surface of the epoxy material 270 may rise above the die 240 to encase the bond wires 250. The epoxy material 270 may assume an approximately semi-spherical shape. In other words, the epoxy material 270 has an approximately rounded top surface, or a "glob top." Note that the epoxy material 270 is corralled within the area defined by the lead finger mounting ring 220. In this way, run-off of the epoxy material 270 can be prevented. It should also be noted that the shape of the top surface of the epoxy material may be dependent on the surface tension, viscosity, temperature, and other properties of epoxy material and/or assembling environment. Thus, the epoxy material 270 may assume other shapes. For instance, the epoxy material 270 may have a top surface that assumes an approximately semi-elliptical shape. Note that the dispensing step 340 is separate and distinct from an injection molding process step. Specifically, in one embodiment, the epoxy material dispensed during step 340 does not enclose the entire die assembly. Rather, only the die and the bond wires are enclosed.

Epoxy materials are well known in the art, and are commercially available.

Figure 1E:
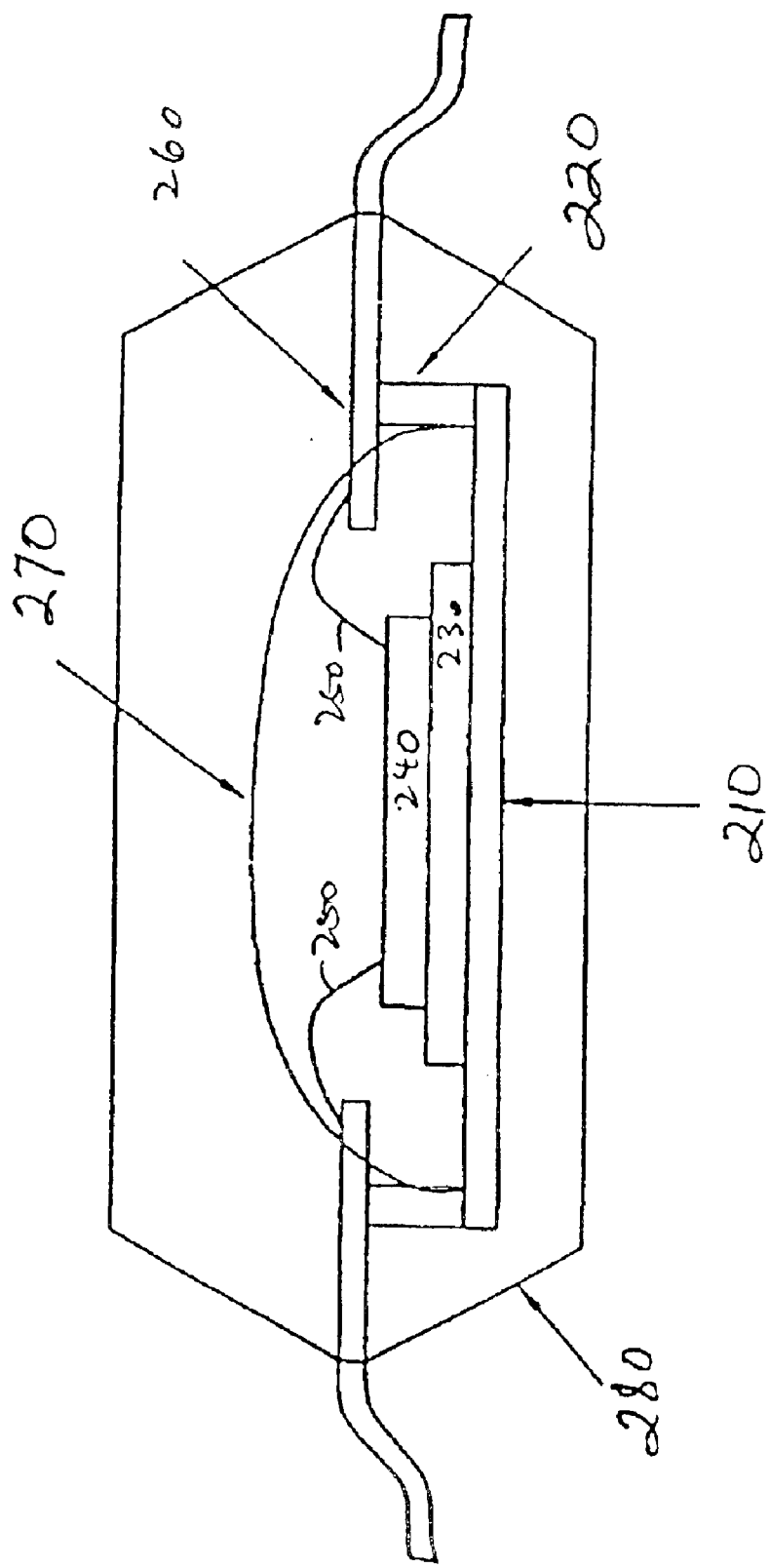

Referring again to FIG. 3, the process 300 includes curing the epoxy material (Box 350). According to the present embodiment, the epoxy material is cured using well known curing techniques. Thereafter, according to the present invention, a molding process (e.g., an injection molding process) is performed to enclose the die assembly in a mold compound (Box 360). The package leads are separated from the lead frame and trimmed. The resultant integrated circuit package is illustrated in FIG. 1E.

During the molding process, the epoxy material acts as a protective layer that immobilizes the bond wires and prevents them from swaying. The bond wires, immobilized by the epoxy material, are thus prevented from forming short-circuits during the molding process. This aspect of the present invention is especially significant to semiconductor dies having a fine pad pitch (e.g., under 60 µm) and having bond wires that are long (e.g., above 3500 µm) and thin (e.g., wire diameter under 25 µm). It should be noted, however, that the present invention is equally applicable to any other types of semiconductor products.

The present invention, a package for a semiconductor die and process for forming the same, has thus been disclosed. The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An integrated circuit package, comprising:

a substrate having a top and a bottom, the top including a center region and a peripheral region;

a semiconductor die positioned on the center region of the substrate, the semiconductor die having a bond pad;

a discrete lead finger mounting ring having an inner perimeter positioned on the peripheral region of the substrate and extending upwards therefrom;

a package lead attached to an upper surface of the lead finger mounting ring;

a bond wire with a first end portion bonded to the package lead and a second end portion bonded to the bond pad;

all of a first material comprising an epoxy material confined within the inner perimeter and forming a first encapsulation over the bond wire, the semiconductor die, and a portion of the package lead; and a second material comprising a mold compound forming a second encapsulation over the first encapsulation, the lead finger mounting ring, the top and the bottom of the substrate, and a portion of the package lead.

2. The package of claim 1, wherein the first encapsulation limits movement of the bond wire during formation of the second encapsulation.

3. The package of claim 1, further comprising a die attachment pad that is attached between the semiconductor die and the substrate.

4. The package of claim 1, wherein the lead finger mounting ring comprises non-conductive material.

5. The package of claim 1, wherein the first protective encapsulation comprises a rounded top surface.

6. An integrated circuit package, comprising:

a substrate having a top and a bottom, the top including a center region and a peripheral region;

a die attachment pad disposed on the center region of the substrate;

a semiconductor die positioned on the die attachment pad, the semiconductor die comprising a plurality of bond pads;

a discrete non-conductive lead finger mounting ring having an inner perimeter positioned on the peripheral region of the substrate and extending upwards therefrom;

a plurality of package leads attached to an upper surface of the lead finger mounting ring;

a plurality of bond wires with first end portions bonded to the package leads and second end portions bonded to the bond pads;

all of a first material comprising an epoxy material confined within the inner perimeter and forming a first encapsulation over the bond wires, the first encapsulation having a rounded top surface; and a second material comprising a mold compound forming a second encapsulation over the first encapsulation, the lead finger mounting ring, and the top and the bottom of the substrate, wherein the first encapsulation limits movement of the bond wires during formation of the second encapsulation.

7. The package of claim 6, wherein a pad pitch between two of the bond pads is under 60 $\mu$m.

8. The package of claim 7, wherein a length of at least one of the bond wires is at least 3500 $\mu$m.

9. The package of claim 8, wherein a wire diameter of the at least one bond wire is under 25 $\mu$m.

* * * * *